United States Patent [19]

Hernandez

[11] Patent Number: 4,594,641

[45] Date of Patent: Jun. 10, 1986

[54] DECOUPLING CAPACITOR AND METHOD OF FORMATION THEREOF

[75] Inventor: Jorge M. Hernandez, Mesa, Ariz.

[73] Assignee: Rogers Corporation, Rogers, Conn.

[21] Appl. No.: 730,278

[22] Filed: May 3, 1985

[51] Int. Cl.$^4$ .................... H01G 1/14; H01G 7/00; H01B 7/00

[52] U.S. Cl. .................... 361/306; 29/25.42; 174/72 B

[58] Field of Search .............. 29/25.42; 361/328, 306; 174/52 FP, 72 B

[56] References Cited

U.S. PATENT DOCUMENTS

| 3,544,857 | 12/1970 | Byrne et al. | 174/52 FP X |
|---|---|---|---|
| 4,266,091 | 5/1981 | Fukuda | 361/306 X |
| 4,399,321 | 8/1983 | Gottlieb | 174/72 B |
| 4,461,924 | 7/1984 | Butt | 174/52 FP |
| 4,475,143 | 10/1984 | Hernandez | 29/25.42 X |
| 4,491,895 | 1/1985 | Gottlieb et al. | 29/25.42 X |

Primary Examiner—Donald A. Griffin
Attorney, Agent, or Firm—Fishman & Dionne

[57] ABSTRACT

A decoupling capacitor is presented including a pair of conductors, each having a lead connected thereto formed from a continuous strip of electrically conductive material (lead frame), the strip having opposing planar surfaces. A pair of dummy leads, each being associated with a conductor, but isolated therefrom, is also formed from the strip. Thereafter, a strip of first insulating material is positioned across from one opposing surface of the conductive strip and a strip of second insulating material having a plurality of openings or windows therein is positioned on the other opposing surface of the conductive strip. The two insulating layers sandwiching the conductive strip are then heat tacked and hot press laminated to form a continuous strip of laminated material. The windows are positioned on the conductive strip to define access opening for the two conductors. Next, drops of solder paste are deposited on each conductor through the windows whereupon a multi-layer monolithic ceramic capacitor is placed through each window, between the two conductors and in contact with the solder paste. The multi-layer capacitor includes first and second conductive end surfaces which are electrically and mechanically bonded respectively to each conductor via the solder (after a reflow process). The multi-layer capacitor is then encapsulated and sealed by placing encapsulant material (i.e., epoxy, silicon, etc.) in the space defined by the window. Finally, the now sealed, laminated and encapsulated decoupling capacitor is severed from the lead frame. The decoupling capacitor of the present invention will thus be both hermetically sealed and automatically insertable for use in conjunction with integrated circuit DIP inserter devices.

26 Claims, 9 Drawing Figures

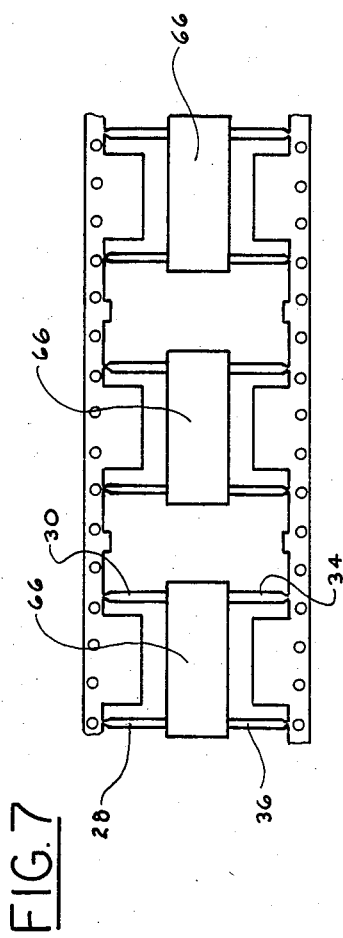
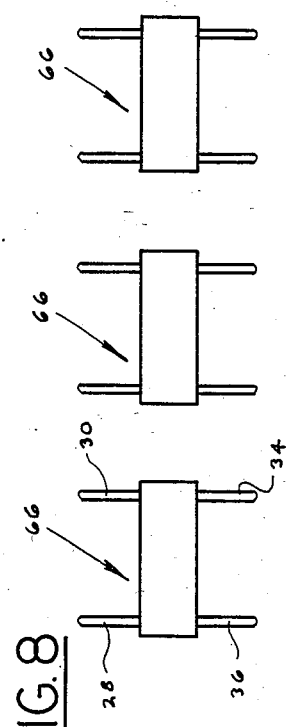
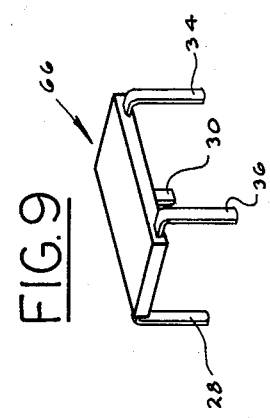

DECOUPLING CAPACITOR AND METHOD OF FORMATION THEREOF

BACKGROUND OF THE INVENTION

This invention relates the field of decoupling capacitors for integrated circuits. More particularly, this invention relates to a novel and improved decoupling capacitor, and method of formation thereof wherein the capacitors are formed from a lead frame which contains the four leads of the capacitor (two of which are electrically inactive "dummy" pins) on a single plane. This lead frame construction permits the decoupling capacitor to be formed from a lamination process followed by encapsulation molding to form decoupling capacitors which are auto-insertable into printed circuit boards for use in conjunction with dual-in-line integrated circuits or other electronic components.

U.S. Pat. No. 4,502,101 (which is assigned to the assignee hereof, and the entire contents of which are incorporated herein by reference) discloses a decoupling capacitor for an integrated circuit package. The decoupling capacitor of that prior application is a thin rectangular chip of ceramic material which is metallized on opposite sides and has leads from the metallized coatings on opposite sides of the chip at two points adjacent a pair of diagonally opposed corners of the rectangularly shaped ceramic chip. The two leads are bent downwardly, and the decoupling capacitor assembly is encapsulated in a film of nonconductive material. In accordance with the teachings of that prior application, the decoupling capacitor is dimensioned so as to be received in the space between the two rows of leads extending from a conventional dual-in-line integrated circuit. The two leads from the decoupling capacitor are plugged into a printed circuit board, with these leads from the capacitor being inserted into the printed circuit through holes to which the ground and power supply conductors are connected. The associated integrated circuit or other electronic component is then positioned over the capacitor and inserted into the board such that the power supply leads of the integrated circuit or other component will be positioned in the same through holes of the printed circuit board in which the two capacitor leads have been inserted.

The diagonally located leads or pins on the decoupling capacitor of U.S. Pat. No. 4,502,101 have resulted in a problem when it is desired to automatically insert the decoupling capacitors into the printed circuit board. Standard auto-insertion equipment is available for inserting integrated circuit elements into the printed circuit boards. The insertion heads on standard auto-insertion equipment grasp the integrated circuit about the bent terminal pins or leads of the integrated circuit. Since there are two symmetric rows of pins on the integrated circuit element, the auto-insertion equipment can grasp the integrated circuit element symmetrically and stably for insertion. However, when insertion of the decoupling capacitor of prior U.S. Pat. No. 4,502,101 is attempted with the same auto-insertion equipment, an unstable condition and misalignment results because of the fact that the decoupling capacitor, rather than having two symmetrical rows of pins, has only two pins at diagonally opposite corners of the rectangular capacitor. Because of the presence of only the two pins, the capacitor "cocks" in the insertion head with the result that misalignment occurs between the terminals of the capacitor in the corresponding holes on the printed circuit board.

Since it is extremely desirable to auto-insert the decoupling capacitors into the printed circuit boards, and since it is equally desirable to perform that auto-insertion with the same auto-insertion equipment used with the integrated circuit elements, a significant problem is encountered with the decoupling capacitor of the prior application, not from the standpoint of its electronic operability and effectiveness, but rather from the standpoint of adapting it to high volume assembly techniques.

A need also exists for a decoupling capacitor structure which is also auto-insertable, hermetically sealed, and capable of being manufactured by automated assembly processes.

U.S. Pat. No. 4,475,143 (assigned to the assignee hereof) discloses one approach to solving the above discussed auto-insertion problem by the incorporation of dummy or stabilizing pins in a decoupling capacitor assembly. U.S. Pat. Nos. 4,491,895, 4,494,169, 4,494,170, 4,497,012, 4,511,951, U.S. patent application Ser. No. 551,468, now U.S. Pat. No. 4,532,572 and U.S. patent application Ser. No. 711,393 to Kask, Hernandez and Watson filed on Mar. 13, 1985 all of which are assigned to the assignee hereof, present other constructions of and methods for forming decoupling capacitors with dummy pins or molded stabilizing lugs.

Presently used manufacturing procedures for decoupling capacitors of the type hereinabove discussed (i.e., which include dummy leads) are not particularly well suited for incorporating multi-layer monolithic ceramic capacitor chips as the capacitive element for the decoupling capacitor device. In effect then, this situation limits the capacitive element to be a single layer capacitor of limited obtainable capacitance per unit volume. However, a method of manufacturing decoupling capacitors with multi-layer ceramic capacitor chips with only two leads (i.e., no dummy leads) is disclosed in U.S. patent application Ser. No. 690,117, which is assigned to the assignee hereof and incorporated herein by reference. An alternative method of manufacturing a decoupling capacitor having four leads and with multi-layer ceramic chips is disclosed in U.S. patent application Ser. No. 711,478 to Schilling, Jodoin and Johnston filed on Mar. 13, 1985. It should be understood that there is a need for efficient and economical decoupling capacitors and methods of manufacture thereof having higher capacitance volumes for use in decoupling the new generation of integrated circuit devices, which are faster and consume more power (i.e., 256K memory integrated circuits). One attempt at overcoming the above-discussed problems is disclosed in my co-pending U.S. patent application Ser. No. 730,468 filed contemporaneously with the present application.

SUMMARY OF THE INVENTION

The above discussed and other problems of the prior art are overcome or substantially reduced by the new and improved decoupling capacitor of the present invention and the method of manufacture thereof. The decoupling capacitor of the present invention is formed from a laminate consisting of a lead frame which contains the four leads of the capacitor (two of which are electrically inactive dummy leads) on a single plane and a pair of insulating layers. The use of such a laminate provides a low cost, auto-insertable and reliable decoupling capacitor which includes high capacitance values as well as other desirable properties, such as temperature stability of capacitance, as a result of the incorporation of multi-layer capacitor chips. The present invention thus presents a construction of and method for forming improved decoupling capacitors which are hermetically sealed, auto-insertable and manufactured in a lead frame followed by lamination and an encapsulation process.

In accordance with the method of the present invention, a pair of conductors, each having a lead connected thereto are formed from a continuous strip of electrically conductive material, the strip having opposing planar surfaces. A pair of dummy leads, each being associated with a conductor, but isolated therefrom, is also formed from the strip. Thereafter, a strip of first insulating material is positioned across from one opposing surface of the conductive strip and a strip of second insulating material having a plurality of openings or windows therein is positioned on the other opposing surface of the conductive strip. The two insulating layers sandwiching the conductive strip are then heat tacked and hot press laminated to form a continuous strip of laminated material. The windows are positioned on the conductive strip to define access opening for the two conductors. Next, drops of solder paste are deposited on each conductor through the windows whereupon a multi-layer monolithic ceramic capacitor is placed through each window, between the two conductors and in contact with the solder paste. The multi-layer capacitor includes first and second conductive end surfaces which are electrically and mechanically bonded respectively to each conductor via the solder (after a reflow process). The multi-layer capacitor is then encapsulated and sealed by placing encapsulant material (i.e., epoxy, silicon, etc.) in the space defined by the window. Finally, the now sealed and encapsulated decoupling capacitor is severed from the lead frame. The decoupling capacitor of the present invention will thus be both hermetically sealed and automatically insertable for use in conjunction with integrated circuit DIP inserter devices.

The above discussed and other features and advantages of the present invention will be apparent to and understood by those skilled in the art from the following detailed description and drawings.

BRIEF DESCRIPTION OF THE DRAWING

FIG. 7 is a plan view of the laminated and encapsulated assembly subsequent to cutting of tie bars, of decoupling capacitors in accordance with the present invention;

FIG. 8 is a plan view of the singulated decoupling capacitors of FIG. 7, prior to lead bending; and FIG. 9 is a perspective view of a finished decoupling capacitor in accordance with the present invention.

DESCRIPTION OF THE PREFERRED EMBODIMENT

The present invention presents a construction of and method for forming improved decoupling capacitors which are hermetically sealed, auto-insertable and manufactured in a lamination process followed by an encapsulation process.

Figure 1:
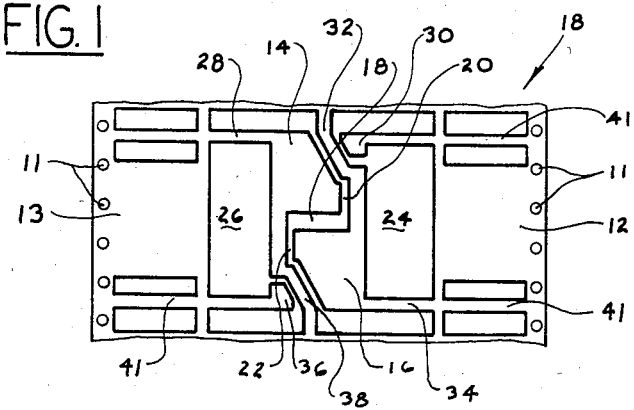
FIG. 1 is a plan view of a lead frame used in forming a decoupling capacitor having a multi-layer ceramic chip therein in accordance with the present invention.

Referring first to FIG. 1, a lead frame used in accordance with the present invention is shown generally at 10. Lead frame 10 is a continuous planar strip of conductive material i.e., copper, which is provided with openings 11 along the respective side edges 12 and 13 thereof for registration and transport. It will be appreciated that FIG. 1 shows only a small portion of a lead frame which is suitable for forming a single decoupling capacitor in accordance with the present invention. It will further be appreciated that lead frame 10 is preferrably a stamped part wherein all the components thereof are rigid. Thus, the desired lead frame configuration is formed by removing unwanted material from the strip of conductive material using any suitable and conventional technique.

Figure 3:
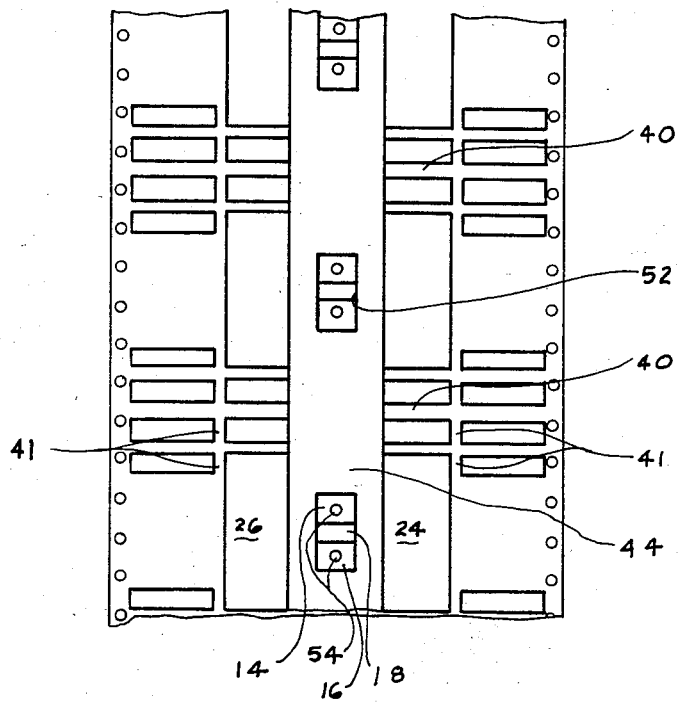
FIG. 3 is a plan view of the assembly of FIG. 2 subsequent to lamination, and before insertion of the multi-layer capacitor chips (MLC)
Figure 2:
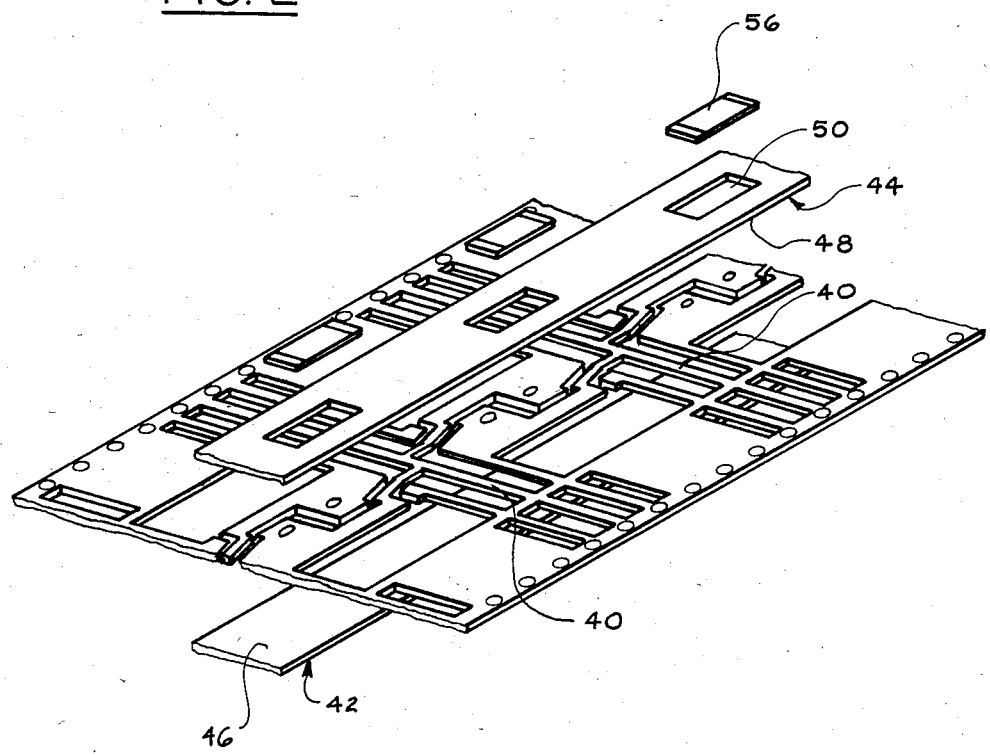
FIG. 2 is an exploded perspective view of the component layers used in forming a decoupling capacitor in accordance with the present invention prior to lamination.

Lead frame 10 includes two conductor body portions 14 and 16 separated therebetween by a horizontal shaped space or opening 18 having two oppositely oriented perpendicular spaces 20 and 22 connected at either side of space 18. Conductors 14 and 16 are further isolated from edge strips 12 and 13 by substantially rectangular openings 24 and 26. Conductor 14 includes an electrically active pin or lead 28 integrally attached thereto and an electrically inactive dummy pin or lead 30 which projects into opening 24 and is isolated from conductor 14 by an extension 32 of conductor 16 and a portion of space 20. Similarly, conductor 16 includes an electrically active pin or lead 34 which is integrally attached thereto and an electrically inactive dummy pin or lead 36 which projects into opening 26 and is separated from conductor 16 by an extension 38 of conductor 14 and a portion of space 22. It will be appreciated that conductors 14 and 16 are supported within lead frame 10, i.e., between edge portions 12 and 13, by active leads 28 and 34 and conductor extensions 32 and 38. As shown in FIGS. 2 and 3, lateral support for conductors 14 and 16 are provided by continuous lateral support structures 40 which support the conductor extensions 32 and 38 to the frame during the various processes. Note that leads 28, 30, 34 and 36 are supported and attached to the respective edge portions 12 and 13 of lead frame 10 by a plurality of support structures or tie bars 41. Finally, lead frame 10 should also include stand-off means (not shown), i.e., dimples for spacing back the decoupling capacitor from the circuit board.

Referring now to FIG. 2 and in accordance with the method of the present invention, lead frame 10 as described hereinabove is sandwiched between two strips of insulating material 42 and 44. Insulating strip or bottom layer 42 is comprised of a suitable insulative polymeric material (i.e., Ultem, Kapton) and is provided with an adhesive coating (i.e., epoxy or other suitable adhesive material) on the surface 46 which will contact lead frame 10. Insulating strip or window layer 44 is similarly comprised of a suitable insulative polymeric material (i.e., Ultem, Kapton) and is also provided with an adhesive coating (i.e., epoxy or other suitable adhesive material) on the surface 48 which will contact lead frame 10. Insulative strip 44 is provided with a plurality of windows or opening 50 which will provide access to exposed portions of both conductors 14 and 16 (See FIG. 3). After the insulative strips 42 and 44 and lead frame 10 are assembled as shown in FIG. 2, the components are heat tacked and hot press laminated to form the laminated assembly of FIG. 3. It will be appreciated that each window 50 of insulative strip 44 will define a cavity or recess 52 which is configured to accept a multi-layer capacitor chip therein.

Figure 6:
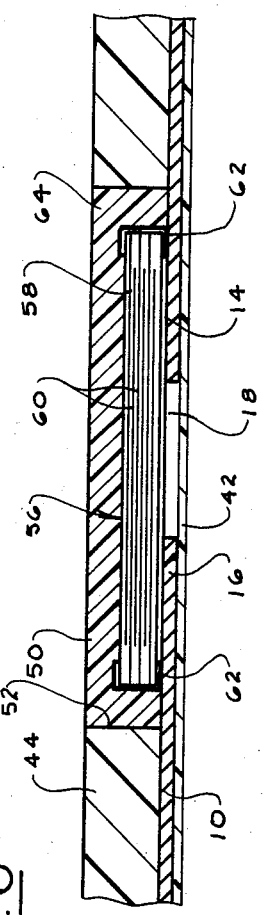
FIG. 6 is an enlarged cross-sectional elevation view of a portion of the decoupling capacitor of FIG. 4 subsequent to insertion of a MLC.
Figure 4:
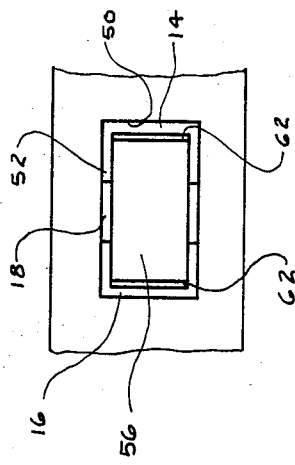
FIG. 4 is a plan view of a portion of the laminated assembly of FIG. 3 subsequent to insertion of the MLC.

Subsequent to assembly and lamination, drops 54 of solder cream or other electrically conductive adhesive material are placed on each conductor 14 and 16 as shown in FIG. 3. Next, a multi-layer ceramic capacitor chip 56 having interleaved layers of ceramic 58 and metal 60 and two conductors 62 at either end is deposited through space 52 of window 50 and placed on solder drops 54 as shown in FIGS. 4 and 6. After the multi-layer capacitor chip 56 is placed in cavity 52, the solder paste 54 is reflowed thereby providing a strong electrical and mechanical bond between each end conductor 62 of the capacitor chip and a respective conductor 14 and 16. Next, the multi-layer capacitor chip 56 is encapsulated within the laminated assembly by delivering a small amount of an encapsulant material 64 (FIG. 6) to recess 52 to provide a hermetically sealed encapsulated assembly. Any suitable encapsulate material may be used including epoxy, silicon, etc.

Figure 5:
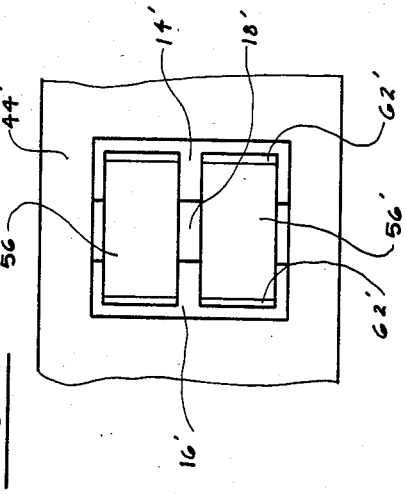
FIG. 5 is a plan view, similar to FIG. 4, of another embodiment of the present invention.

While the above discussion has been with regard to the use of a single multi-layer capacitor chip, it will be appreciated that more than one capacitor chip may be used in accordance with the present invention. For example, in FIG. 5, two capacitor chips 56' are shown prior to the encapsulating step. It should be understood that the relative dimensioning of window 50, cavity 52 and the conductors 14 and 16 will be varied in accordance with the number and dimensions of the multi-layer capacitor chips which are used.

Turning now to FIGS. 7-9, the individual decoupling capacitors now identified at 66 are then separated from edge portions 11 and 13 of lead frame 10 by severing support structures 40 and the lead supports (tie bars) 41 as shown in FIG. 7. The electrically active leads 28 and 34 and electrically inactive "dummy" leads 30 and 36 are then singulated from lead frame 10 (FIG. 8) and bent downwardly about 90 degrees as shown in FIG. 9.

The decoupling capacitor construction generally identified at 66 thus includes a pair of electrically isolated dummy leads 30 and 36 and a pair of electrically active leads 28 and 34 which are integrally attached to conductors 14 and 16, respectively. In turn, conductors 14 and 16 are electrically attached to electrodes 62 of multi-layer capacitor 56. The whole assembly is laminated and encapsulated as discussed hereinabove with only the two electrically active leads 28 and 34 and the two electrically inactive leads 30 and 36 protruding outwardly therefrom.

As discussed, decoupling capacitor 66 utilizes a high capacitance multi-layer monolithic ceramic chip capacitor 56. Such a capacitor provides much higher capacitance values along with other desirable properties such as a flat capacitance vs. temperature characteristics, than are obtainable using convention planar single layer ceramic capacitors.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. The method of making a capacitor, including the steps of:
   removing unwanted material from a strip of electrically conductive material having opposed planar surfaces to define a first conductor having a first active lead connected thereto and a second conductor having a second active lead connected thereto;
   removing further unwanted material from said strip of electrically conductive material to define a first dummy lead associated with said first conductor, but electrically isolated therefrom, and a second dummy lead associated with said second conductor, but electrically isolated therefrom, said first and second active leads and said first and second dummy leads being in the same plane;
   placing a first strip of electrically insulative material in contact with one of said opposed surfaces of said strip of electrically conductive material;
   placing a second strip of electrically insulative material in contact with the other of said opposed surfaces of said conductive strip, said second insulative strip having windows therethrough wherein said windows expose at least a portion of said first and second conductors and wherein said windows define a recess;
   providing adhesive between said first and second insulative strips and said conductive strips;
   bonding the above elements to form a laminated assembly with said first and second insulative strips and said conductive strips bonded together;
   placing at least one multilayer capacitor element through said recess and between said first and second conductors, said capacitor element having first and second conductive end surfaces, with said first conductive end surface being in electrical contact with said first conductor and said second conductive end surface being in electrical contact with said second conductor;
   delivering encapsulate material to said recess wherein said multilayer capacitor element is encapsulated within said laminated assembly.

2. The method of claim 1 wherein said step of removing unwanted material from said electrically conductive material further includes the steps of:
   forming support structure for supporting said first and second conductors in said conductive strip; and
   severing said support structure.

3. The method of claim 1 wherein said step of removing unwanted material from said electrically conductive material further includes the steps of:
   forming support structure for supporting said first and second leads and said dummy leads in said conductive strip; and
   severing said support structure.

4. The method of claim 1 including:
   forming registration holes in said strip of electrically conductive material.

5. The method of claim 1 wherein:

said active leads are at a first pair of diagonally opposed locations and said dummy leads are at a second pair of diagonally opposed locations.

6. The method of claim 1 wherein:
said capacitive element is a ceramic material having interleaved conductive layers with a pair of conductive end surfaces.

7. The method of claim 1 including the step of:
providing set-off means on said encapsulated assembly.

8. The method of claim 1 further including the step of:
severing said first and second active leads and said first and second dummy leads from said conductive strip.

9. The method of claim 1 including:
placing an electrical adhesive material through said recess onto said first and second conductors.

10. The method of claim 9 wherein said electrical adhesive material is solder and including the step of:
reflowing said solder after placing it on said first and second conductors.

11. The method of claim 1 wherein said windows are substantially rectangular.

12. The method of claim 1 wherein the bonding step comprises the steps of:
heat tacking the elements; and
hot press laminating the elements.

13. A capacitor including:
a first electrical conductor;
a second electrical conductor spaced from said first conductor, said first and second conductors defining a plane having opposed surfaces;
a first active lead extending from said first conductor at a first position;
a second active lead extending from said second conductor at a second position;
a first dummy lead associated with said first conductor, but electrically isolated therefrom at a third position;
a second dummy lead associated with said second conductor, but electrically isolated therefrom at a fourth position;
at least a portion of said first and second active leads and said first and second dummy leads being in the same plane;
a first layer of electrically insulative material laminated to a one of said opposed surfaces of said first and second conductors;
a second layer of electrically insulative material laminated to the other of said opposed surfaces of said conductors, said second layer having windows therethrough wherein said windows expose at least a portion of said first and second conductors and wherein said windows define a recess, said conductors, active and dummy leads and first and second insulative layers defining a laminated assembly;
at least one multilayer capacitive element in said recess and between said first and second conductors, said capacitive element having first and second conductive end surfaces, with said first conductive end surface being in electrical contact with said first conductor and said second conductive end surface being in electrical contact with said second conductor; and
encapsulate material in said recess wherein said multilayer capacitor element is encapsulated within said laminated assembly.

14. The capacitor of claim 13 wherein:
said first and second conductive end surfaces of said capacitive element are bonded to said first and second conductors, respectively.

15. The capacitor of claim 14 wherein:
said bonding is accomplished by a conductive adhesive.

16. The capacitor of claim 13 wherein:
said active leads are at a first pair of diagonally opposed locations and said dummy leads are at a second pair of diagonally opposed locations.

17. The capacitor of claim 13 wherein:
said capacitive element is a ceramic material having interleaved conductive layers with a pair of conductive end surfaces.

18. The capacitor of claim 13 including:
set-off means on said laminated assembly.

19. The capacitor of claim 13 wherein:
said windows are substantially rectangular.

20. An array of capacitors positioned between a pair of edge strips from which a pair of conductors and active and dummy leads of the capacitors are formed, each of said capacitors having:
a first electrical conductor;
a second electrical conductor spaced from said first conductor, said first and second conductors defining a plane having opposed surfaces;
a first active lead extending from said first conductor at a first position;
a second active lead extending from said second conductor at a second position;
a first dummy lead associated with said first conductor, but electrically isolated therefrom at a third position;
a second dummy lead associated with said second conductor, but electrically isolated therefrom at a fourth position;
at least a portion of said first and second active leads and said first and second dummy leads being in the same plane;
a first layer of electrically insulative material laminated to a one of said opposed surfaces of said first and second conductors;
a second layer of electrically insulative material laminated to the other of said opposed surfaces of said conductors, said second layer having windows therethrough wherein said windows expose at least a portion of said first and second conductors and wherein said windows define a recess, said conductors, active and dummy leads and first and second insulative layers defining a laminated assembly;
at least one multilayer capacitive element in said recess and between said first and second conductors, said capacitive element having first and second conductive end surfaces, with said first conductive end surface being in electrical contact with said first conductor and said second conductive end surface being in electrical contact with said second conductor; and
encapsulate material in said recess wherein said multilayer capacitor element is encapsulated within said laminated assembly.

21. The capacitor of claim 20 wherein:
said first and second conductive end surfaces of said capacitive element are bonded to said first and second conductors, respectively.

22. The capacitor of claim 21 wherein:

said bonding is accomplished by a conductive adhesive.

23. The capacitor of claim 20 wherein:
said active leads are at a first pair of diagonally opposed locations and said dummy leads are at a second pair of diagonally opposed locations.

24. The capacitor of claim 20 wherein:
said capacitive element is a ceramic material having interleaved conductive layers with a pair of conductive end surfaces.

25. The capacitor of claim 20 including:
set-off means on said laminated assembly.

26. The capacitor of claim 20 wherein:
said windows are substantially rectangular.

* * * * *